(12) United States Patent
Kim et al.

(10) Patent No.: US 9,831,859 B2
(45) Date of Patent: Nov. 28, 2017

(54) BUFFER CIRCUIT, SEMICONDUCTOR INTEGRATED CIRCUIT, AND SYSTEM INCLUDING THE BUFFER CIRCUIT

(71) Applicant: SK hynix Inc., Icheon-si, Gyeonggi-do (KR)

(72) Inventors: Ji Hwan Kim, Icheon-si (KR); Young Jun Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/047,989

(22) Filed: Feb. 19, 2016

(65) Prior Publication Data

US 2017/0111034 A1    Apr. 20, 2017

(30) Foreign Application Priority Data

Oct. 20, 2015    (KR) .................. 10-2015-0145845

(51) Int. Cl.
*H03K 5/15* (2006.01)
*H03K 5/135* (2006.01)
*H03K 5/26* (2006.01)

(52) U.S. Cl.
CPC .............. *H03K 5/15* (2013.01); *H03K 5/135* (2013.01); *H03K 5/26* (2013.01)

(58) Field of Classification Search
CPC ............. H03K 5/15; H03K 5/135; H03K 5/26
USPC ................. 327/261–264, 269, 270, 276–278
See application file for complete search history.

(56) References Cited

U.S. PATENT DOCUMENTS

| | | | | |
|---|---|---|---|---|
| 7,671,649 B2* | 3/2010 | Na | .............. | G06F 1/06 327/158 |
| 2003/0185088 A1* | 10/2003 | Kono | .................. | G11C 7/1066 365/233.1 |
| 2005/0001927 A1* | 1/2005 | Tanimoto | ............... | H04N 5/335 348/372 |
| 2006/0267649 A1* | 11/2006 | Park | ..................... | H03K 5/1565 327/158 |
| 2007/0046347 A1* | 3/2007 | Lee | ........................ | H03L 7/0814 327/158 |
| 2008/0062809 A1* | 3/2008 | Lee | .......................... | G11C 7/22 365/233.1 |
| 2008/0204103 A1* | 8/2008 | Jung | ........................ | G06F 1/10 327/288 |
| 2008/0303574 A1* | 12/2008 | Lee | ........................ | H03H 11/26 327/263 |
| 2009/0115486 A1* | 5/2009 | Na | ............................. | G06F 1/06 327/295 |
| 2011/0234279 A1* | 9/2011 | Kim | ..................... | H03L 7/0816 327/158 |

(Continued)

FOREIGN PATENT DOCUMENTS

KR    100477809 B1    3/2005

*Primary Examiner* — Brandon S Cole
(74) *Attorney, Agent, or Firm* — William Park & Associates Ltd.

(57) ABSTRACT

According to an embodiment, a buffer circuit may be provided. The buffer circuit may include a first buffer configured to receive first and second external clock signals and generate a first pre-clock signal based on falling timings of the first and second external clock signals. The buffer circuit may include a second buffer configured to receive the first and second external clock signals and generate a second pre-clock signal based on raising timings of the first and second external clock signals.

16 Claims, 5 Drawing Sheets

(56) References Cited

U.S. PATENT DOCUMENTS

2011/0267112 A1\* 11/2011 Lee ................ H03K 19/018528
 327/108

\* cited by examiner

BUFFER CIRCUIT, SEMICONDUCTOR INTEGRATED CIRCUIT, AND SYSTEM INCLUDING THE BUFFER CIRCUIT

CROSS-REFERENCES TO RELATED APPLICATION

The present application claims priority under 35 U.S.C. §119(a) to Korean application number 10-2015-0145845, filed on Oct. 20, 2015, in the Korean Intellectual Property Office, which is incorporated herein by reference in its entirety.

BACKGROUND

1. Technical Field

Various embodiments generally relate to a semiconductor integrated circuit, and, more particularly, to a buffer circuit.

2. Related Art

Semiconductor integrated circuits are trending towards high speed operations with high degrees of integration.

Semiconductor integrated circuits are configured to operate in synchronization with a clock signal.

However, a semiconductor integrated circuit performing high speed operations is configured to include a buffer circuit to receive and operate with a clock signal inputted from an exterior.

SUMMARY

According to an embodiment, a buffer circuit may be provided. The buffer circuit may include a first buffer configured to generate a first pre-clock signal based on a first external clock signal and a second external clock signal. The buffer circuit may include a second buffer configured to generate a second pre-clock signal based on the first external clock signal and the second external clock signal. The buffer circuit may include a delay control block configured to generate a plurality of delay control signals based on the first and second pre-clock signals. The buffer circuit may include a first delay configured to determine a delay time based on the plurality of delay control signals, delay the first pre-clock signal by the determined delay time, and output a first internal clock signal. The buffer circuit may include a second delay configured to determine a delay time based on the plurality of delay control signals, delay the second pre-clock signal by the determined delay time, and output a second internal clock signal.

According to an embodiment, a buffer circuit may be provided. The buffer circuit may include a pull-up circuit configured to pull up a node at each falling timing of a first input clock. The buffer circuit may include a pull-down circuit configured to pull down the node at each falling timing of a second input clock. A level of an output clock may be determined at the node.

According to an embodiment, a buffer circuit may be provided. The buffer circuit may include a pull-up circuit configured to pull up a node at each raising timing of a first input clock signal. The buffer circuit may include a pull-down circuit configured to pull down the node at each rising timing a second input clock signal. A level of an output clock signal may be determined at the node.

According to an embodiment, a buffer circuit may be provided. The buffer circuit may include a first buffer configured to receive first and second external clock signals and generate a first pre-clock signal based on falling timings of the first and second external clock signals. The buffer circuit may include a second buffer configured to receive the first and second external clock signals and generate a second pre-clock signal based on raising timings of the first and second external clock signals.

DETAILED DESCRIPTION

Hereinafter, a buffer circuit may be described below with reference to the accompanying drawings through various examples of embodiments.

Figure 1:
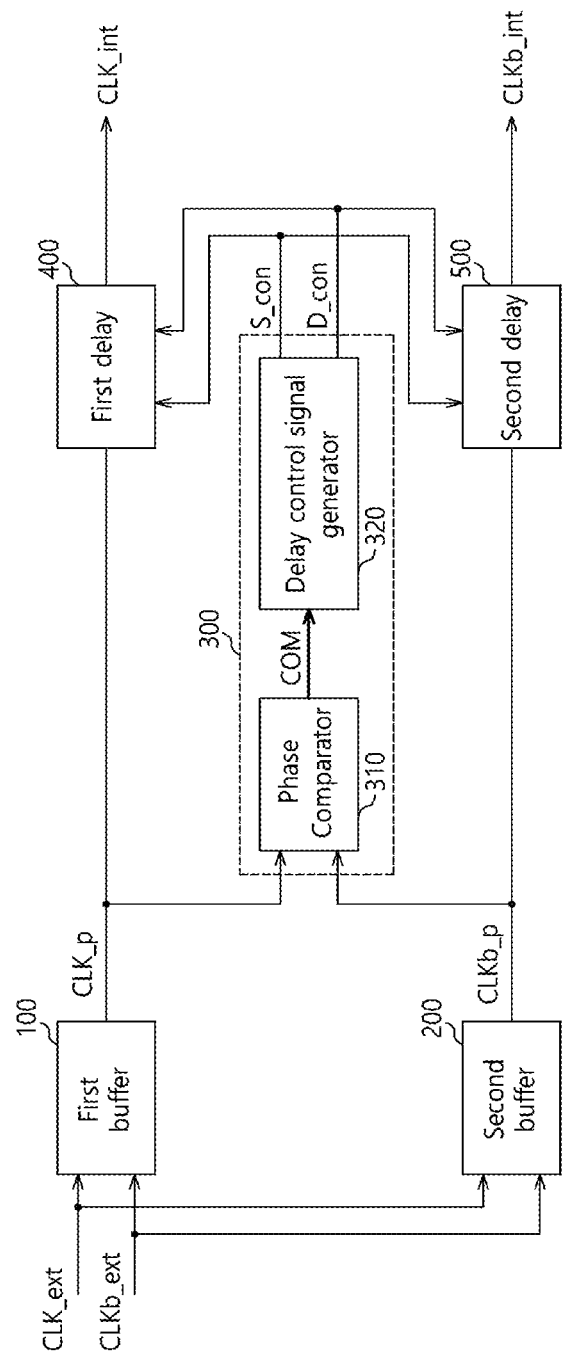
FIG. 1 is a configuration diagram illustrating a representation of an example of a buffer circuit in accordance with an embodiment.

Referring to FIG. 1, a buffer circuit in accordance with an embodiment may include a first buffer 100, a second buffer 200, a delay control block 300, a first delay 400, and a second delay 500.

The first buffer 100 may generate a first pre-clock signal CLK_p in response to a first external clock signal CLK_ext and a second external clock signal CLKb_ext. For example, the first buffer 100 may generate the first pre-clock signal CLK_p which transitions at the respective falling timings of the first external clock signal CLK_ext and the second external clock signal CLKb_ext. For example, the first buffer 100 may cause the first pre-clock signal CLK_p to transition to a high level, that is, rise, at each falling timing of the first external clock signal CLK_ext. The first buffer 100 may cause the first pre-clock signal CLK_p to transition to a low level, that is, fall, at each falling timing of the second external clock signal CLKb_ext.

The second buffer 200 may generate a second pre-clock signal CLKb_p in response to the first external clock signal CLK_ext and the second external clock signal CLKb_ext. For example, the second buffer 200 may generate the second pre-clock signal CLKb_p which transitions at the respective rising timings of the first external clock signal CLK_ext and the second external clock signal CLKb_ext. For example, the second buffer 200 may cause the second pre-clock signal CLKb_p to transition to a high level, that is, rise, at each rising timing of the second external clock signal CLKb_ext. The second buffer 200 may cause the second pre-clock signal CLKb_p to transition to a low level, that is, fall, at each rising timing of the first external clock signal CLK_ext. The first and second external clock signals CLK_ext and CLKb_ext may be clocks which are provided from an exterior and have opposite phases.

The delay control block 300 may generate a first delay control signal S_con and a second delay control signal D_con in response to the first and second pre-clock signals CLK_p and CLKb_p. For example, the delay control block 300 may compare the phases of the first and second pre-clock signals CLK_p and CLKb_p, and generate the first and second delay control signals S_con and D_con. For example, the delay control block 300 may enable the first delay control signal S_con in the case where the phases of the first and second pre-clock signals CLK_p and CLKb_p are the same, disable the first delay control signal S_con in the case where the phases of the first and second pre-clock signals CLK_p and CLKb_p are different from each other, and determine whether to enable the second delay control signal D_con, according to the phase of which pre-clock between the first and second pre-clock signals CLK_p and CLKb_p is earlier.

The delay control block 300 may include a phase comparator 310 and a delay control signal generator 320.

The phase comparator 310 may compare the phases of the first and second pre-clock signals CLK_p and CLKb_p, and generate a comparison signal COM. For example, the phase comparator 310 may enable the comparison signal COM when the phase of the first pre-clock signal CLK_p is later than the phase of the second pre-clock signal CLKb_p. The phase comparator 310 may disable the comparison signal COM when the phase of the first pre-clock signal CLK_p is earlier than the phase of the second pre-clock signal CLKb_p.

The delay control signal generator 320 may generate the first and second delay control signals S_con and D_con in response to the comparison signal COM. For example, the delay control signal generator 320 may disable the first delay control signal S_con when the comparison signal COM is retained at any one level of a first level and a second level for a predetermined time, and enable or disable the second delay control signal D_con according to a retained level. The delay control signal generator 320 may enable the first delay control signal S_con when the comparison signal COM transitions alternately to the first and second levels during the predetermined time.

The first delay 400 may determine a delay time in response to the first and second delay control signals S_con and D_con, delay the first pre-clock signal CLK_p by the determined delay time, and output a first internal clock signal CLK_int. For example, the first delay 400 may output the first internal clock signal CLK_int without delaying the first pre-clock signal CLK_p in response to the first and second delay control signals S_con and D_con. The first delay 400 may output the first internal clock signal CLK_int by delaying the first pre-clock signal CLK_p by the delay time determined in response to the first and second delay control signals S_con and D_con.

The second delay 500 may determine a delay time in response to the first and second delay control signals S_con and D_con, delay the second pre-clock signal CLKb_p by the determined delay time, and output a second internal clock signal CLKb_int. For example, the second delay 500 may output the second internal clock signal CLKb_int without delaying the second pre-clock signal CLKb_p in response to the first and second delay control signals S_con and D_con. The second delay 500 may output the second internal clock signal CLKb_int by delaying the second pre-clock signal CLKb_p by the delay time determined in response to the first and second delay control signals S_con and D_con.

Figure 2:
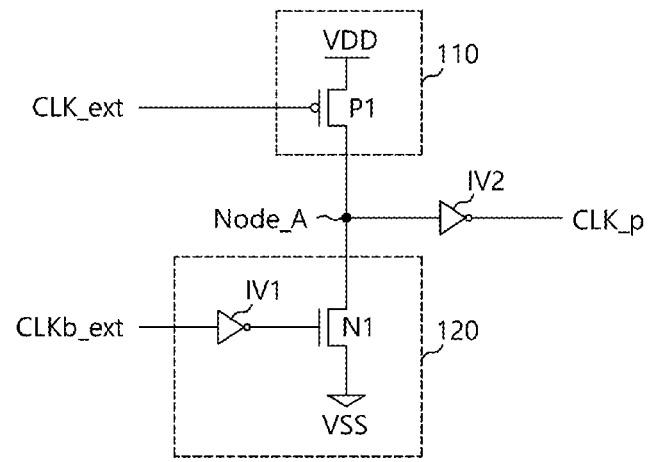
FIG. 2 is a configuration diagram illustrating a representation of an example of the first buffer illustrated in FIG. 1.

Referring to FIG. 2, the first buffer 100 may include a first pull-up circuit 110 and a first pull-down circuit 120.

The first pull-up circuit 110 may pull up a first node Node_A in response to the first external clock signal CLK_ext. For example, the first pull-up circuit 110 may pull up the first node Node_A at the falling timing of the first external clock signal CLK_ext.

The first pull-up circuit 110 may include a first transistor P1. The first transistor P1 may have a gate which is inputted with the first external clock signal CLK_ext, a source which is applied with an external voltage VDD, and a drain to which the first node Node_A is coupled.

The first pull-down circuit 120 may pull down the first node Node_A in response to the second external clock signal CLKb_ext. For example, the first pull-down circuit 120 may pull down the first node Node_A at the falling timing of the second external clock signal CLKb_ext.

The first pull-down circuit 120 may include a second transistor N1 and a first inverter IV1. The first inverter IV1 may be inputted with the second external clock signal CLKb_ext. The second transistor N1 may have a gate which is inputted with the output signal of the first inverter IV1, a drain to which the first node Node_A is coupled, and a source to which a ground terminal VSS is coupled.

The first buffer 100 may further include a second inverter IV2 which drives the voltage level of the first node Node_A and outputs the first pre-clock signal CLK_p.

Figure 3:
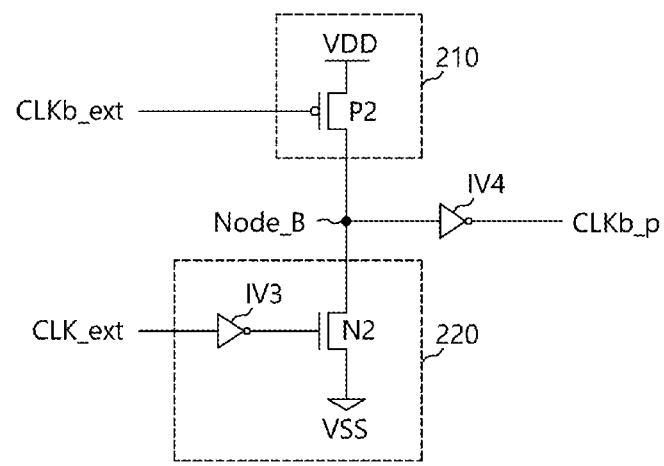
FIG. 3 is a configuration diagram illustrating a representation of an example of the second buffer illustrated in FIG. 1.

Referring to FIG. 3, the second buffer 200 may include a second pull-up circuit 210 and a second pull-down circuit 220.

The second pull-up circuit 210 may pull up a second node Node_B in response to the second external clock signal CLKb_ext. For example, the second pull-up circuit 210 may pull up the second node Node_B at the rising timing of the second external clock signal CLKb_ext.

The second pull-up circuit 210 may include a third transistor P2. The third transistor P2 may have a gate which is inputted with the second external clock signal CLKb_ext, a source which is applied with the external voltage VDD, and a drain to which the second node Node_B is coupled.

The second pull-down circuit 220 may pull down the second node Node_B in response to the first external clock signal CLK_ext. For example, the second pull-down circuit 220 may pull down the second node Node_B at the rising timing of the first external clock signal CLK_ext.

The second pull-down circuit 220 may include a fourth transistor N2 and a third inverter IV3. The third inverter IV3 may be inputted with the first external clock signal CLK_ext. The fourth transistor N2 may have a gate which is inputted with the output signal of the third inverter IV3, a drain to which the second node Node_B is coupled, and a source to which the ground terminal VSS is coupled.

The second buffer 200 may further include a fourth inverter IV4 which drives the voltage level of the second node Node_B and outputs the second pre-clock signal CLKb_p.

Figure 4:
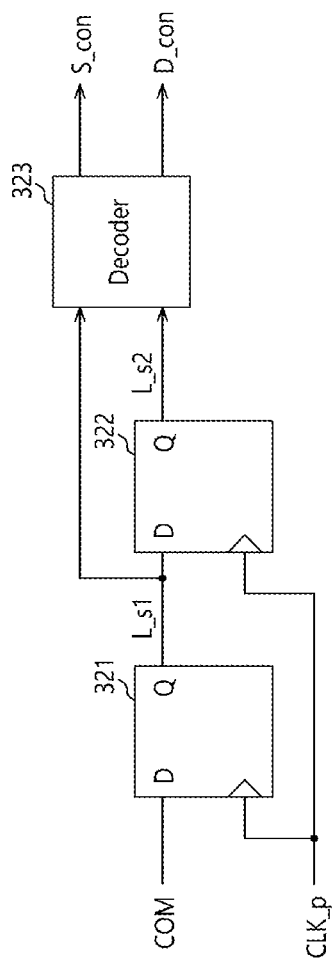
FIG. 4 is a configuration diagram illustrating a representation of an example of the delay control signal generator illustrated in FIG. 1.

Referring to FIG. 4, the delay control signal generator 320 may include a first latch circuit 321, a second latch circuit 322, and a decoder 323.

The first latch circuit 321 may synchronize the comparison signal COM with the first pre-clock signal CLK_p, and generate a first latch signal L_s1. For example, the first latch circuit 321 may be inputted with and latch the comparison signal COM at the rising timing of the first pre-clock signal CLK_p, and output the latched signal as the first latch signal L_s1. The first latch circuit 321 may be configured by a flip-flop.

The second latch circuit 322 may synchronize the first latch signal L_s1 with the first pre-clock signal CLK_p, and generate a second latch signal L_s2. For example, the second latch circuit 322 may be inputted with and latch the first latch signal L_s1 at the rising timing of the first pre-clock signal CLK_p, and output the latched signal as the second latch signal L_s2. The second latch circuit 322 may be configured by a flip-flop.

The decoder 323 may decode the first and second latch signals L_s1 and L_s2, and generate the first and second delay control signals S_con and D_con. For example, the decoder 323 disables the first delay control signal S_con in the case where the first and second latch signals L_s1 and L_s2 are the same level, and determines whether to enable or disable the second delay control signal D_con, according to the levels of the first and second latch signals L_s1 and L_s2. The decoder 323 enables, for example, the first delay control signal S_con in the case where the first and second latch signals L_s1 and L_s2 are different levels. The decoder 323 disregards the second delay control signal D_con in the case where the first and second latch signals L_s1 and L_s2 are different levels.

| L_s1 | L_s2 | S_con | D_con |
|------|------|-------|-------|
| Low  | Low  | Low   | Low   |
| Low  | High | High  | X     |
| High | Low  | High  | X     |
| High | High | Low   | High  |

As in the above Table, for example, the decoder 320 may decode the first and second latch signals L_s1 and L_s2, and generate the first and second delay control signals S_con and D_con.

Figure 5:
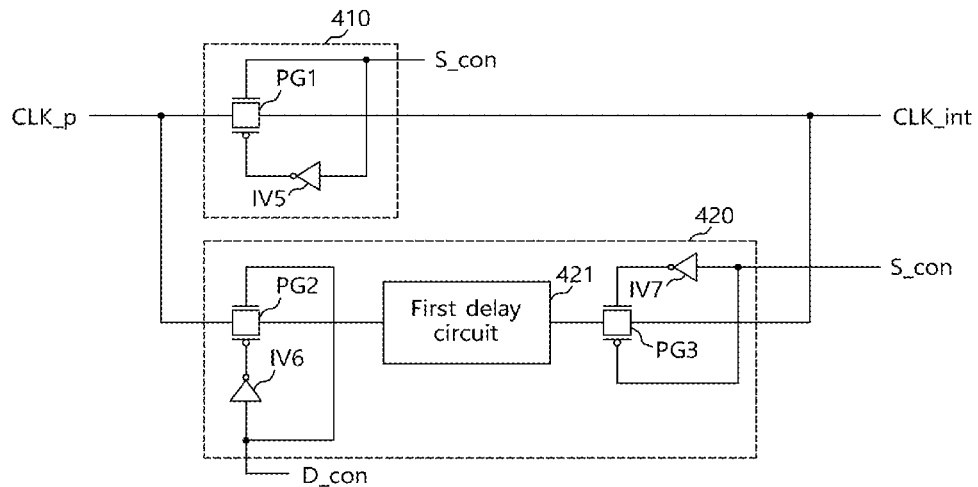
FIG. 5 is a configuration diagram illustrating a representation of an example of the first delay illustrated in FIG. 1.

Referring to FIG. 5, the first delay 400 may include a first switch 410 and a first delay switch 420.

The first switch 410 may output the first pre-clock signal CLK_p as the first internal clock signal CLK_int in response to the first delay control signal S_con. For example, the first switch 410 may output the first pre-clock signal CLK_p as the first internal clock signal CLK_int when the first delay control signal S_con is enabled.

The first switch 410 may include a first pass gate PG1 and a fifth inverter IV5. The fifth inverter IV5 may be inputted with the first delay control signal S_con. The first pass gate PG1 may have an input terminal which is inputted with the first pre-clock signal CLK_p, a first control terminal which is inputted with the first delay control signal S_con, a second control terminal which is inputted with the output signal of the fifth inverter IV5, and an output terminal which outputs the first internal clock signal CLK_int.

The first delay switch 420 may delay the first pre-clock signal CLK_p in response to the first and second delay control signals S_con and D_con, and output the first internal clock signal CLK_int. For example, the first delay switch 420 may delay the first pre-clock signal CLK_p and output the first internal clock signal CLK_int when the first delay control signal S_con is disabled and the second delay control signal D_con is enabled.

The first delay switch 420 may include second and third pass gates PG2 and PG3, sixth and seventh inverters IV6 and IV7, and a first delay circuit 421. The sixth inverter IV6 may be inputted with the second delay control signal D_con. The second pass gate PG2 may have an input terminal which is inputted with the first pre-clock signal CLK_p, a first control terminal which is inputted with the second delay control signal D_con, and a second control terminal which is inputted with the output signal of the sixth inverter IV6. The first delay circuit 421 is inputted with and delays the signal outputted from the output terminal of the second pass gate PG2, and outputs a resultant signal to the input terminal of the third pass gate PG3. The seventh inverter IV7 may be inputted with the first delay control signal S_con. The third pass gate PG3 may have an input terminal which is inputted with the output signal of the first delay circuit 421, a first control terminal which is inputted with the output signal of the seventh inverter IV7, a second control terminal which is inputted with the first delay control signal S_con, and an output terminal which outputs the first internal clock signal CLK_int.

Figure 6:
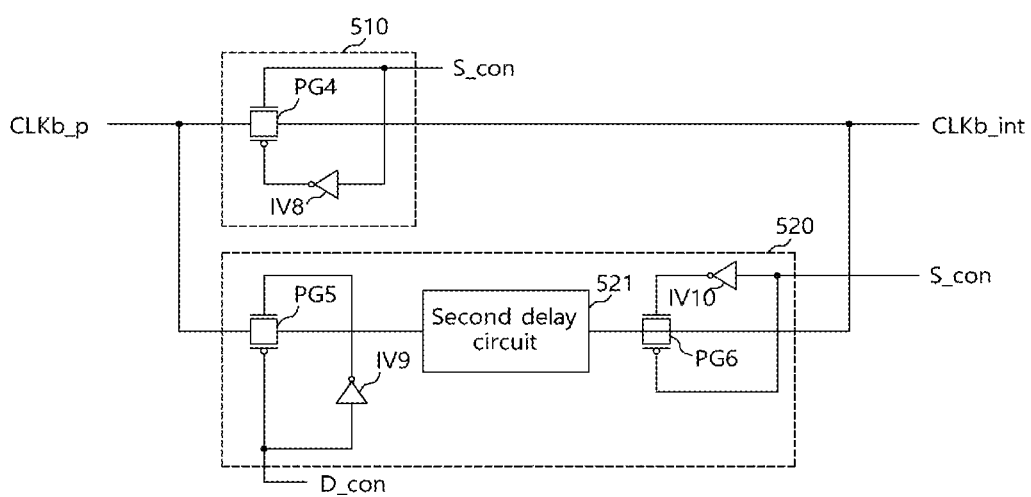
FIG. 6 is a configuration diagram illustrating a representation of an example of the second delay illustrated in FIG. 1.

Referring to FIG. 6, the second delay 500 may include a second switch 510 and a second delay switch 520.

The second switch 510 may output the second pre-clock signal CLKb_p as the second internal clock signal CLKb_int in response to the first delay control signal S_con. For example, the second switch 510 may output the second pre-clock signal CLKb_p as the second internal clock signal CLKb_int when the first delay control signal S_con is enabled.

The second switch 510 may include a fourth pass gate PG4 and an eighth inverter IV8. The eighth inverter IV8 may be inputted with the first delay control signal S_con. The fourth pass gate PG4 may have an input terminal which is inputted with the second pre-clock signal CLKb_p, a first control terminal which is inputted with the first delay control signal S_con, a second control terminal which is inputted with the output signal of the eighth inverter IV8, and an output terminal which outputs the second internal clock signal CLKb_int.

The second delay switch 520 may delay the second pre-clock signal CLKb_p in response to the first and second delay control signals S_con and D_con, and output the second internal clock signal CLKb_int. For example, the second delay switch 520 may delay the second pre-clock signal CLKb_p and output the second internal clock signal CLKb_int when the first delay control signal S_con is disabled and the second delay control signal D_con is disabled.

The second delay switch 520 may include fifth and sixth pass gates PG5 and PG6, ninth and tenth inverters IV9 and IV10, and a second delay circuit 521. The ninth inverter IV9 may be inputted with the second delay control signal D_con. The fifth pass gate PG5 may have an input terminal which is inputted with the second pre-clock signal CLKb_p, a first control terminal which is inputted with the output signal of the ninth inverter IV9, and a second control terminal which is inputted with the second delay control signal D_con. The second delay circuit 521 is inputted with and delays the signal outputted from the output terminal of the fifth pass gate PG5, and outputs a resultant signal to the input terminal of the sixth pass gate PG6. The tenth inverter IV10 may be inputted with the first delay control signal S_con. The sixth pass gate PG6 may have an input terminal which is inputted with the output signal of the second delay circuit 521, a first control terminal which is inputted with the output signal of the tenth inverter IV10, a second control terminal which is inputted with the first delay control signal S_con, and an output terminal which outputs the second internal clock signal CLKb_int.

The buffer circuit in accordance with an embodiment, configured as mentioned above, may operate as follows.

The first buffer 100 generates the first pre-clock signal CLK_p in response to the first external clock signal CLK_ext and the second external clock signal CLKb_ext. The phases of the first external clock signal CLK_ext and the second external clock signal CLKb_ext are opposite to each other.

With reference to FIG. 2, the operation of the first buffer 100 will be described below.

For example, the first buffer 100 causes the first pre-clock signal CLK_p to rise to the high level, at the falling timing of the first external clock signal CLK_ext. Also, the first buffer 100 causes the first pre-clock signal CLK_p to fall to the low level, at the falling timing of the second external clock signal CLKb_ext. Therefore, the first pre-clock signal CLK_p generated by the first buffer 100 is a clock which transitions at the respective falling timings of the first and second external clock signals CLK_ext and CLKb_ext.

The second buffer 200 generates the second pre-clock signal CLKb_p in response to the first external clock signal CLK_ext and the second external clock signal CLKb_ext. The phases of the first external clock signal CLK_ext and the second external clock signal CLKb_ext are opposite to each other.

With reference to FIG. 3, the operation of the second buffer 200 will be described below.

For example, the second buffer 200 causes the second pre-clock signal CLKb_p to rise to the high level, at the rising timing of the second external clock signal CLKb_ext. Also, the second buffer 200 causes the second pre-clock signal CLKb_p to fall to the low level, at the rising timing of the first external clock signal CLK_ext. Therefore, the second pre-clock signal CLKb_p generated by the second buffer 200 is a clock which transitions at the respective rising timings of the first and second external clock signals CLK_ext and CLKb_ext, and has phases opposite to the first pre-clock signal CLK_p.

The delay control block 300 compares the phases of the first and second pre-clock signals CLK_p and CLKb_p, and generates the first and second delay control signals S_con and D_con. For example, the delay control block 300 enables the first delay control signal S_con when it is determined that the phases of the first and second pre-clock signals CLK_p and CLKb_p are the same. The delay control block 300 disables the first delay control signal S_con when it is determined that the phases of the first and second pre-clock signals CLK_p and CLKb_p are different from each other, and enables or disables the second delay control signal D_con according to the phase of which pre-clock between the first and second pre-clock signals CLK_p and CLKb_p is earlier.

The delay control block 300 may include the phase comparator 310 and the delay control signal generator 320.

The phase comparator 310 compares the phases of the first and second pre-clock signals CLK_p and CLKb_p, and generates the comparison signal COM. For example, the phase comparator 310 enables the comparison signal COM when the phase of the second pre-clock signal CLKb_p is earlier than the phase of the first pre-clock signal CLK_p. The phase comparator 310 disables the comparison signal COM when the phase of the first pre-clock signal CLK_p is earlier than the phase of the second pre-clock signal CLKb_p.

The delay control signal generator 320 generates the first and second delay control signals S_con and D_con in response to the comparison signal COM. With reference to FIG. 4, an example of the operation of the delay control signal generator 320 will be described below. The delay control signal generator 320 may include the first and second latch circuits 321 and 322 and the decoder 323. The first latch circuit 321 is inputted with and latches the comparison signal COM when the first pre-clock signal CLK_p transitions to the high level, and outputs the latched signal as the first latch signal L_s1. The second latch circuit 322 is inputted with and latches the first latch signal L_s1 when the first pre-clock signal CLK_p transitions to the high level, and outputs the latched signal as the second latch signal L_s2. The decoder 323 decodes the first and second latch signals L_s1 and L_s2, and generates the first and second delay control signals S_con and D_con. In other words, the delay control signal generator 320 decodes the comparison signal COM when the first pre-clock signal CLK_p transitions to a first high level and the comparison signal COM when the first pre-clock signal CLK_p transitions to a second high level, and generates the first and second delay control signals S_con and D_con. The decoder 323 enables the first delay control signal S_con to a high level in the case where the level of the comparison signal COM when the first pre-clock signal CLK_p transitions to the first high level and the level of the comparison signal COM when the first pre-clock signal CLK_p transitions to the second high level are the same. The decoder 323 disables the first delay control signal S_con to a low level in the case where the level of the comparison signal COM when the first pre-clock signal CLK_p transitions to the first high level and the level of the comparison signal COM when the first pre-clock signal CLK_p transitions to the second high level are different from each other, and determines whether to enable or disable the second delay control signal D_con, according to the level of the latched comparison signal COM. For example, the decoder 323 disables the second delay control signal D_con to a low level if the level of the latched comparison signal COM is a low level in the case where the level of the comparison signal COM when the first pre-clock signal CLK_p transitions to the first high level and the level of the comparison signal COM when the first pre-clock signal CLK_p transitions to the second high level are the same. The decoder 323 enables the second delay control signal D_con to a high level if the level of the latched comparison signal COM is a high level in the case where the level of the comparison signal COM when the first pre-clock signal CLK_p transitions to the first high level and the level of the comparison signal COM when the first pre-clock signal CLK_p transitions to the second high level are the same.

The first delay 400 may output the first internal clock signal CLK_int without delaying the first pre-clock signal CLK_p and output the first internal clock signal CLK_int by delaying the first pre-clock signal CLK_p, in response to the first and second delay control signals S_con and D_con. With reference to FIG. 5, an example of the operation of the first delay 400 will be described below. The first delay 400 turns on the first switch 410 when the first delay control signal S_con is enabled, such that the first pre-clock signal CLK_p may be outputted as the first internal clock signal CLK_int without being delayed. The first delay 400 turns on the first delay switch 420 when the second delay control signal D_con is enabled, such that the first pre-clock signal CLK_p may be outputted as the first internal clock signal CLK_int by being delayed. The turn-on of the first switch 410 means the turn-on of the first pass gate PG1, and the turn-on of the first delay switch 420 means the turn-on of the second and third pass gates PG2 and PG3.

The second delay 500 may output the second internal clock signal CLKb_int without delaying the second pre-clock signal CLKb_p and output the second internal clock signal CLKb_int by delaying the second pre-clock signal CLKb_p, in response to the first and second delay control signals S_con and D_con. With reference to FIG. 6, an example of the operation of the second delay 500 will be described below. The second delay 500 turns on the second switch 510 when the first delay control signal S_con is enabled, such that the second pre-clock signal CLKb_p may be outputted as the second internal clock signal CLKb_int without being delayed. The second delay 500 turns on the second delay switch 520 when the second delay control signal D_con is disabled, such that the second pre-clock signal CLKb_p may be outputted as the second internal clock signal CLKb_int by being delayed. The turn-on of the second switch 510 means the turn-on of the fourth pass gate PG4, and the turn-on of the second delay switch 520 means the turn-on of the fifth and sixth pass gates PG5 and PG6.

In this way, the buffer circuit in accordance with an embodiment may generate the first and second pre-clock signals CLK_p and CLKb_p which have opposite phases, by using the respective falling timings of the first and second external clock signals CLK_ext and CLKb_ext which are inputted from the exterior and have opposite phases. Therefore, the buffer circuit in accordance with an embodiment may generate the first and second pre-clock signals CLK_p and CLKb_p which have the same duty, that is, the same high level duration and low level duration, even though one timing of the falling timings or the rising timings of the first and second external clock signals CLK_ext and CLKb_ext varies. In addition, by comparing the phases of the first and second pre-clock signals CLK_p and CLKb_p, if the phases of the first and second pre-clock signals CLK_p and CLKb_p are the same, the first and second pre-clock signals CLK_p and CLKb_p are outputted as the first and second internal clock signals CLK_int and CLKb_int. By comparing the phases of the first and second pre-clock signals CLK_p and CLKb_p, if the phases of the first and second pre-clock signals CLK_p and CLKb_p are different from each other, it is possible to generate the first and second internal clock signals CLK_int and CLKb_int which have the same phase, by delaying one clock signal of the first and second pre-clock signals CLK_p and CLKb_p.

Figure 7:
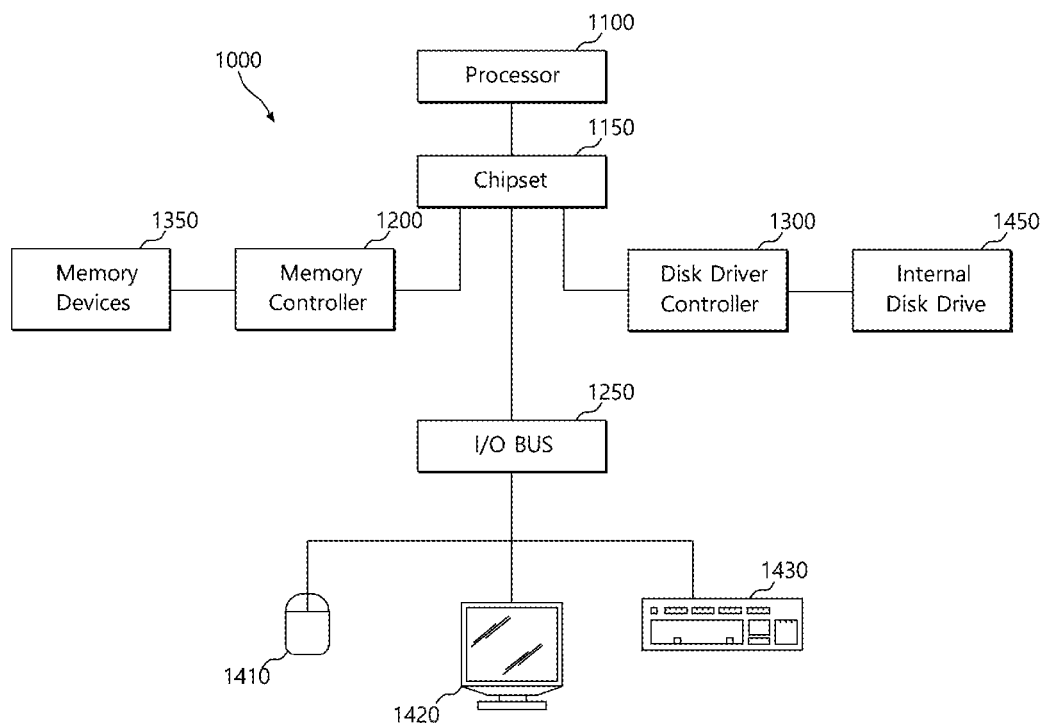
FIG. 7 illustrates a block diagram of an example of a representation of a system employing a buffer circuit with the various embodiments discussed above with relation to FIGS. 1-6.

The buffer circuits and/or semiconductor integrated circuits including the same as discussed above (see FIGS. 1-6) are particular useful in the design of memory devices, processors, and computer systems. For example, referring to FIG. 7, a block diagram of a system employing a buffer circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least buffer circuit as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one buffer circuit as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a buffer circuit as discussed above with relation to FIGS. 1-6. In alternate embodiments, such as, for example but not limited to, cellular phones or digital cameras, the components may differ from the embodiments illustrated in FIG. 7.

While various embodiments have been described above, it will be understood to those skilled in the art that the embodiments described are examples only. Accordingly, the buffer circuit described herein should not be limited based on the described embodiments.

What is claimed is:

1. A buffer circuit comprising:
   a first buffer configured to generate a first pre-clock signal only based on falling timings of a first external clock signal and a second external clock signal;
   a second buffer configured to generate a second pre-clock signal only based on rising timings of the first external clock signal and the second external clock signal;
   a delay control block configured to generate a plurality of delay control signals based on the first and second pre-clock signals;
   a first delay configured to determine a delay time in response to the plurality of delay control signals, delay the first pre-clock signal by the determined delay time, and output a first internal clock signal; and a second delay configured to determine a delay time based on the plurality of delay control signals, delay the second pre-clock signal by the determined delay time, and output a second internal clock signal.

2. The buffer circuit according to claim 1, wherein the first buffer causes the first pre-clock signal to transition at respective falling timings of the first external clock signal and the second external clock signal.

3. The buffer circuit according to claim 1, wherein the second buffer causes the second pre-clock signal to transition at respective rising timings of the first external clock signal and the second external clock signal.

4. The buffer circuit according to claim 1, wherein the delay control block compares phases of the first and second pre-clock signals, and generates the plurality of delay control signals.

5. The buffer circuit according to claim 4,
wherein the plurality of delay control signals comprise a first delay control signal and a second delay control signal, and
wherein, when the phases of the first and second pre-clock signals are the same, the delay control block enables the first delay control signal, and, when the phases of the first and second pre-clock signals are different from each other, the delay control block disables the first delay control signal and determines whether to enable the second delay control signal, according to a phase of which pre-clock signal between the first and second pre-clock signals is earlier.

6. The buffer circuit according to claim 5, wherein the delay control block comprises:
a phase comparator configured to compare the phases of the first and second pre-clock signals, and generate a comparison signal; and
a delay control signal generator configured to generate the first and second delay control signals in response to the comparison signal.

7. The buffer circuit according to claim 6,
wherein, when the comparison signal is retained at any one level of a first level and a second level for a predetermined time, the delay control signal generator disables the first delay control signal and enables or disables the second delay control signal according to a retained level, and
wherein, when the comparison signal transitions alternately to the first and second levels during the predetermined time, the delay control signal generator enables the first delay control signal.

8. The buffer circuit according to claim 6, wherein the delay control signal generator comprises:
a first latch circuit configured to synchronize the comparison signal with the first pre-clock signal, and generate a first latch signal;
a second latch circuit configured to synchronize the first latch signal with the first pre-clock signal, and generate a second latch signal; and
a decoder configured to decode the first and second latch signals, and generate the first and second delay control signals.

9. The buffer circuit according to claim 1, wherein the first delay does not delay the first pre-clock signal in response to the plurality of delay control signals and outputs the first internal clock signal, or delays the first pre-clock signal by the determined delay time in response to the plurality of delay control signals and outputs the first internal clock signal.

10. The buffer circuit according to claim 9,
wherein the plurality of delay control signals comprise a first delay control signal and a second delay control signal, and
wherein the first delay comprises:
a switch configured to output the first pre-clock signal as the first internal clock signal, when the first delay control signal is enabled; and
a delay switch configured to delay the first pre-clock signal and output the first internal clock signal, when the second delay control signal is enabled.

11. The buffer circuit according to claim 9, wherein the second delay does not delay the second pre-clock signal in response to the plurality of delay control signals and outputs the second internal clock signal, or delays the second pre-clock signal by the determined delay time in response to the plurality of delay control signals and outputs the second internal clock signal.

12. The buffer circuit according to claim 11,
wherein the plurality of delay control signals comprise a first delay control signal and a second delay control signal, and
wherein the second delay comprises:
a switch configured to output the second pre-clock signal as the second internal clock signal, when the first delay control signal is enabled; and
a delay switch configured to delay the second pre-clock signal and output the second internal clock signal, when the second delay control signal is disabled.

13. A buffer circuit comprising:
a first buffer configured to receive first and second external clock signals and generate a first pre-clock signal only based on falling timings of the first and second external clock signals;
a second buffer configured to receive the first and second external clock signals and generate a second pre-clock signal only based on raising timings of the first and second external clock signals,
wherein if the phases of the first and second pre-clock signals are the same, the first and second pre-clock signals are outputted as first and second internal clock signals,
wherein if the phases of the first and second pre-clock signals are different from each other, the first and second internal clock signals are generated to have the same phases by delaying one of either the first pre-clock signal or the second pre-clock signal.

14. The buffer circuit according to claim 13,
wherein the first and second external clock signals have different phases, and
wherein the first and second pre-clock signals have different phases.

15. The buffer circuit according to claim 13,
wherein the first and second pre-clock signals have the same duty, and
wherein the falling timings or the rising timings of the first and second external clock signals vary.

16. The buffer circuit according to claim 13, further comprising:
a delay control block configured to generate a plurality of delay control signals based on the first and second pre-clock signals;

a first delay configured to determine a delay time in response to the plurality of delay control signals and output the first internal clock signal;
a second delay configured to determine a delay time based on the plurality of delay control signals and output the second internal clock signal.

* * * * *